United States Patent
Kwon et al.

(10) Patent No.: US 10,964,656 B2
(45) Date of Patent: Mar. 30, 2021

(54) SEMICONDUCTOR PACKAGE AND METHOD OF MANUFACTURING SAME

(71) Applicant: Nepes CO., LTD., Chungcheongbuk-do (KR)

(72) Inventors: Yong Tae Kwon, Chungcheongbuk-do (KR); Hee Cheol Kim, Chungcheongnam-do (KR); Seung Jun Moon, Gyeonggi-do (KR); Jini Shim, Gyeonggi-do (KR)

(73) Assignee: NEPES CO., LTD., Chungcheongbuk-do (KR)

( * ) Notice: Subject to any disclaimer, the term of this patent is extended or adjusted under 35 U.S.C. 154(b) by 20 days.

(21) Appl. No.: 16/427,033

(22) Filed: May 30, 2019

(65) Prior Publication Data

US 2019/0378807 A1 Dec. 12, 2019

(30) Foreign Application Priority Data

Jun. 12, 2018 (KR) .................. 10-2018-0067622

(51) Int. Cl.
*H01L 23/00* (2006.01)

(52) U.S. Cl.
CPC .............. *H01L 24/16* (2013.01); *H01L 24/03* (2013.01); *H01L 24/05* (2013.01); *H01L 24/11* (2013.01); *H01L 24/13* (2013.01); *H01L 2224/0218* (2013.01); *H01L 2224/0233* (2013.01); *H01L 2224/02181* (2013.01); *H01L 2224/0401* (2013.01); *H01L 2224/10122* (2013.01); *H01L 2224/13005* (2013.01); *H01L 2224/1601* (2013.01); *H01L 2224/16225* (2013.01); *H01L 2924/3512* (2013.01)

(58) Field of Classification Search
CPC ......... H01L 24/16; H01L 24/03; H01L 24/05; H01L 24/13; H01L 24/11; H01L 2224/0233; H01L 2224/1601; H01L 2224/02181; H01L 2224/0401; H01L 2224/10122; H01L 2924/3512; H01L 2224/13005; H01L 2224/16225; H01L 2224/0218; H01L 2224/81801; H01L 2224/05572; H01L 24/81; H01L 2224/13101
See application file for complete search history.

(56) References Cited

U.S. PATENT DOCUMENTS

2013/0320518 A1* 12/2013 Chun ...................... H01L 24/94
257/712

* cited by examiner

*Primary Examiner* — Karen Kusumakar
(74) *Attorney, Agent, or Firm* — Umberg Zipser LLP (57) ABSTRACT

The present invention relates to a semiconductor package and a method of manufacturing the same. In a semiconductor package which electrically connects a semiconductor chip and a printed circuit board using a solder ball, the semiconductor package further includes a thermal buffer layer which is positioned on a semiconductor chip, absorbs and disperse heat generated by the semiconductor chip, increases a distance between the semiconductor chip and a printed circuit board to decrease a deviation of a heat conduction process, and has a thickness ranging from 7.5 to 50% of a diameter of a solder ball.

16 Claims, 9 Drawing Sheets

PRIOR ART

SEMICONDUCTOR PACKAGE AND METHOD OF MANUFACTURING SAME

CROSS-REFERENCE TO RELATED APPLICATION

This application claims priority to and the benefit of Korean Patent Application No. 10-2018-0067622, filed on Jun. 12, 2018, the disclosure of which is incorporated herein by reference in its entirety.

BACKGROUND

1. Field of the Invention

The present invention relates to a semiconductor package and a method of manufacturing the same, and more particularly, to a stacked semiconductor package and a method of manufacturing the same.

2. Discussion of Related Art

Generally, since electrode terminals of a printed circuit board are electrically connected to pads of a semiconductor chip by conductive wires in a semiconductor package formed using a wire bonding method, a size of the semiconductor package is greater than that of the semiconductor chip, a time period for the wire bonding process is increased, and thus there are limitations in miniaturization and mass production.

Particularly, since the semiconductor chip is highly integrated and has high performance and high speed, various efforts for miniaturizing and mass producing the semiconductor package have been attempted. As an example, a semiconductor package was proposed in which pads of a semiconductor chip are directly electrically connected to electrode terminals of a printed circuit board using bumps formed of a solder or metal material on the pads of the semiconductor chip.

A flip chip ball grid array (FCBGA) method or a wafer level chip size/scale package (WLCSP) method is typically applied to a semiconductor package using bumps formed of a solder material, and a chip-on-glass/tape carrier package (TCP) method is applied to a semiconductor package using bumps formed of a metal material.

The semiconductor package is manufactured using the FCBGA method in which the bumps formed of the solder material in contact with pads of a semiconductor chip are electrically connected to pads of a substrate, an under fill process is performed to protect the bumps formed of the solder material from an external environment or mechanical problems, and solder balls are bonded to a rear surface of the substrate in contact with the semiconductor chip to electrically connect the semiconductor chip to electrode terminals of a printed circuit board. A WLCSP may be manufactured to have the same size as through rearrangement and bumps formed of the metal material for light-weighting, thinning, shortening, and miniaturization.

The semiconductor package is manufactured using the chip-on-glass method in which the bumps formed of the metal material are formed on pads of a semiconductor chip, thermally compressed against electrode terminals of a printed circuit board with a polymer including anisotropic conductive particles, which is interposed there between, and cured to electrically connect the pads of the semiconductor chip to the electrode terminals of the printed circuit board using the bumps formed of the metal material.

Hereinafter, an example structure of a semiconductor package will be described in which pads of a semiconductor chip are electrically connected to electrode terminals of a printed circuit board using conventional solder balls.

Figure 1:
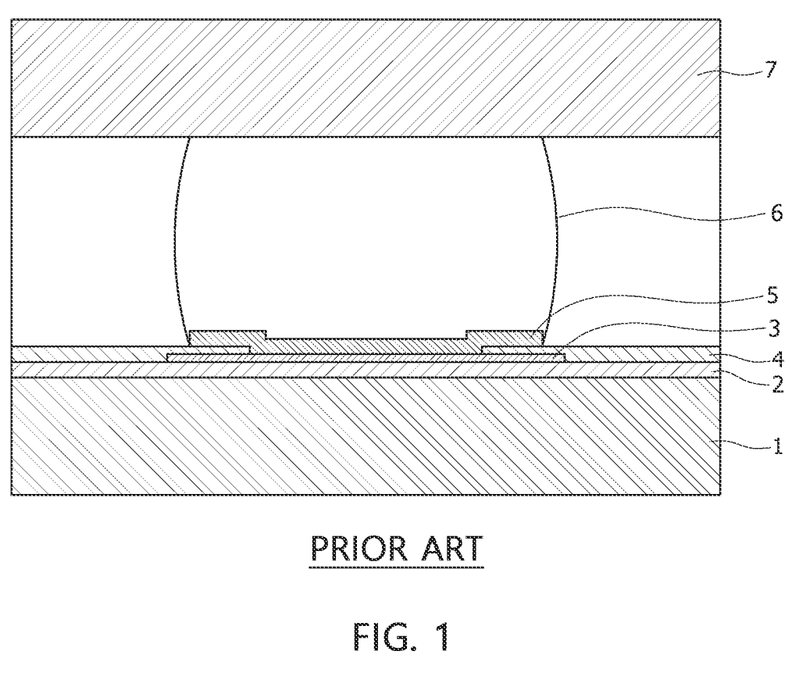
FIG. 1 is a cross-sectional view illustrating a part of a conventional semiconductor package.

FIG. 1 is a cross-sectional view illustrating a part of a conventional semiconductor package.

Referring to FIG. 1, the conventional semiconductor package includes a resin coated film (RCF) 2 disposed on an entire upper surface of a semiconductor chip 1, a re-distribution layer (RDL) 3 positioned on a part of an upper portion of the resin coated film 2, a passivation layer 4 formed around the re-distribution layer 3 and formed on an upper surface of the resin coated film 2 to expose an upper central portion of the re-distribution layer 3, an under bump metallization (UBM) 5 in contact with the exposed re-distribution layer 3, a solder ball 6 positioned on the UBM 5, and a printed circuit board 7 of which an electrode part is in contact with the solder ball 6.

In such a structure, the semiconductor chip 1 may be a wafer level chip, and a thickness thereof may be different according to a product.

The above-described structure is a structure in which an electrode part formed on the semiconductor chip 1 is electrically connected to the electrode part of the printed circuit board 7 using the solder ball 6, and a thickness of the solder ball 6 is about 200 μm.

In addition, the re-distribution layer 3 and the UBM 5, which are conductive layers, are respectively formed to have thicknesses of about 6 μm and 9 μm, and each of the resin coated film 2 and the passivation layer 4, which are non-conductive layers, is formed to have a thickness of about 10 μm.

The thicknesses of the solder ball 6, the re-distribution layer 3, the under bump metallization 5, the resin coated film 2, and the passivation layer 4 are applied regardless of the thickness of the semiconductor chip 1 or extent of heating.

When the conventional semiconductor package having the above-described structure is tested, power is supplied to the semiconductor chip 1 through the printed circuit board 7. At this time, heat is generated by the printed circuit board 7 due to a resistance component of the printed circuit board 7 itself and a contact resistance component between the printed circuit board 7 and the solder ball 6.

In addition, heat is also generated by the semiconductor chip 1 which receives the power to perform a predetermined function due to a resistance component of the semiconductor chip 1 itself and a contact resistance component.

Here, a temperature of the semiconductor chip 1 may be different from that of the printed circuit board 7, and a stress is applied to the solder ball 6 due to different thermal expansion coefficients thereof.

Particularly, one solder ball 6 is illustrated in FIG. 1, but a plurality of solder balls are used in the semiconductor package, and the stress is applied to the plurality of solder balls 6 due to a difference in extent of thermal expansion in a longitudinal (or lateral) direction between the semiconductor chip 1 and the printed circuit board 7, and thus the stress applied to the solder ball 6 positioned on an edge thereof is greater than the stress applied to the solder ball positioned on a central portion thereof.

A crack may occur in the solder ball 6 due to the stress.

When the crack occurs in the solder ball 6, properties of the semiconductor package are changed due to an increase in resistance, and in a serious case, the semiconductor package may be unusable.

SUMMARY OF THE INVENTION

The present invention is directed to providing a semiconductor package, in which a crack is prevented from occurring in a solder ball electrically connecting a semiconductor chip and a printed circuit board, and a method of manufacturing the same.

In addition, the present invention is directed to providing a semiconductor package having a contact structure of which state is physically more stable, and a method of manufacturing the same.

According to an aspect of the present invention, there is provided a semiconductor package which electrically connects a semiconductor chip and a printed circuit board using a solder ball, and the semiconductor package further includes a thermal buffer layer which is positioned on a semiconductor chip, absorbs and disperse heat generated by the semiconductor chip, increases a distance between the semiconductor chip and the printed circuit board to decrease a deviation of a heat conduction process, and has a thickness ranging from 7.5 to 50% of a diameter of a solder ball.

The thermal buffer layer may be a resin coated film in contact with one surface of the semiconductor chip or a passivation layer formed on the resin coated film.

The thermal buffer layer may have the thickness ranging from 15 to 100 μm.

The passivation layer may have a multilayer structure, wherein a lowest layer of the multilayer structure may be positioned on an entirety of the resin coated layer, and a highest layer of the multilayer structure may be positioned on a part of the resin coated layer such that a step is formed on an under bump metallization on which the solder ball is seated.

The under bump metallization may include a lower region of the step, which is a region in contact with a re-distribution layer, an upper region of the step, which is positioned on the passivation layer, and a step surface, which connects the upper region and the lower region of the step, a central portion of the solder ball may be positioned on the lower region of the step, and a peripheral portion of the solder ball may be positioned on the upper region of the step.

The thickness of the thermal buffer layer and a thickness of the semiconductor chip may be adjusted such that an overall thickness of the semiconductor package is constant.

The semiconductor package may further include an epoxy molding compound which supports a side portion of the solder ball on the thermal buffer layer.

According to another aspect of the present invention, there is provided a method of manufacturing a semiconductor package, the method including a) forming a resin coated film on a semiconductor chip and forming a re-distribution layer in contact with an electrode of the semiconductor chip on a part of an upper portion of the resin coated film; b) forming a passivation layer which is positioned on the resin coated film and is a thermal buffer layer, which exposes an upper central portion of the re-distribution layer, to have a thickness ranging from 7.5 to 50% of a diameter of a solder ball; c) forming an under bump metallization in contact with the re-distribution layer; and d) forming the solder ball which electrically connects the under bump metallization and a printed circuit board.

According to still another aspect of the present invention, there is provided a method of manufacturing a semiconductor package, the method including a-1) forming a resin coated film, which is a thermal buffer layer, on a semiconductor chip to have a thickness ranging from 7.5 to 50% of a diameter of a solder ball and forming a re-distribution layer in contact with an electrode of the semiconductor chip on a part of an upper portion of the resin coated film; b-1) forming a passivation layer which is positioned on the resin coated film and is a thermal buffer layer which exposes an upper central portion of the re-distribution layer; c-1) forming an under bump metallization in contact with the re-distribution layer; and d-1) forming the solder ball which electrically connects the under bump metallization and a printed circuit board.

The passivation layer may be formed as a plurality of layers, wherein a lowest layer of the plurality of layers may be formed on an entirety of the resin coated film, and a highest layer thereof may be formed to be positioned under a peripheral portion of the under bump metallization.

The under bump metallization may include a lower region of a step, which is a region in contact with the re-distribution layer, an upper region of the step, which is positioned on the passivation layer, and a step surface which connects the upper region and the lower region of the step, a central portion of the solder ball may be positioned on the lower region of the step, and a peripheral portion of the solder ball may be positioned on the upper region of the step.

The method may further include forming an epoxy molding compound which supports a side portion of the solder ball on the thermal buffer layer.

A thickness of the thermal buffer layer and a thickness of the semiconductor chip may be adjusted such that an overall thickness of the semiconductor package is constant.

A rear surface of the semiconductor chip may be ground by an amount by which the thickness of the thermal buffer layer is increased.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, a semiconductor package and a method of manufacturing the same of the present invention will be described in detail with reference to the accompanying drawings.

Embodiments of the present invention are provided to more completely describe the present invention to those skilled in the art, the embodiments described below will be changed into various different forms, and the scope of the present invention is not limited to the following embodiments. Further, the embodiments are provided to make the present invention more complete and true and to convey the spirit of the present invention to the skilled in the art.

The terms used herein are provided only to describe specific embodiments of the present invention and are not for purposes of limitation. Unless the context clearly indicates otherwise, the singular forms described in the specification include the plural forms. In addition, the terms "comprise" or "comprising," when used herein, specify some stated shapes, numbers, steps, operations, members, elements, and/or presence of groups thereof, but do not preclude one or more other shapes, numbers, operations, members, elements, and/or presence or addition of groups thereof. The term "and/or" includes any and all combinations of the associated listed items.

It should be clear that, although the terms "first," "second," etc. may be used herein to describe various members, regions, and/or portions, these members, components, regions, layers, and/or portions are not to be limited by these terms. These terms do not imply specific orders, positions, or superiority and are only used to distinguish one member, region, or portion from another member, region, or portion. Accordingly, a first member, region, or portion could be termed a second member, region, or portion without departing from the description of the present invention.

Hereinafter, the embodiments of the present invention will be described with reference to the drawings schematically illustrating the embodiments of the present invention. In the drawings, for example, it will be expected that illustrated shapes may be changed according to manufacturing skills and/or tolerances. Accordingly, the embodiments of the present invention should not be interpreted to be limited by specific shapes of illustrated regions, and for example, should include changes in shapes caused when manufactured.

Figure 2:
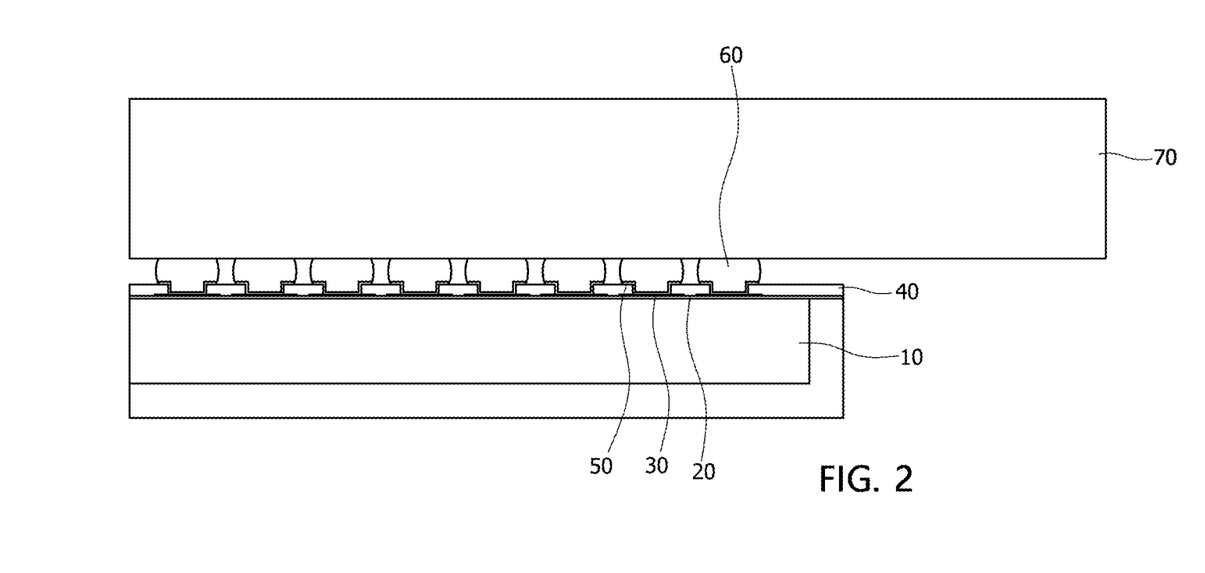
FIG. 2 is a cross-sectional view illustrating a semiconductor package according to an exemplary embodiment of the present invention.
Figure 3:
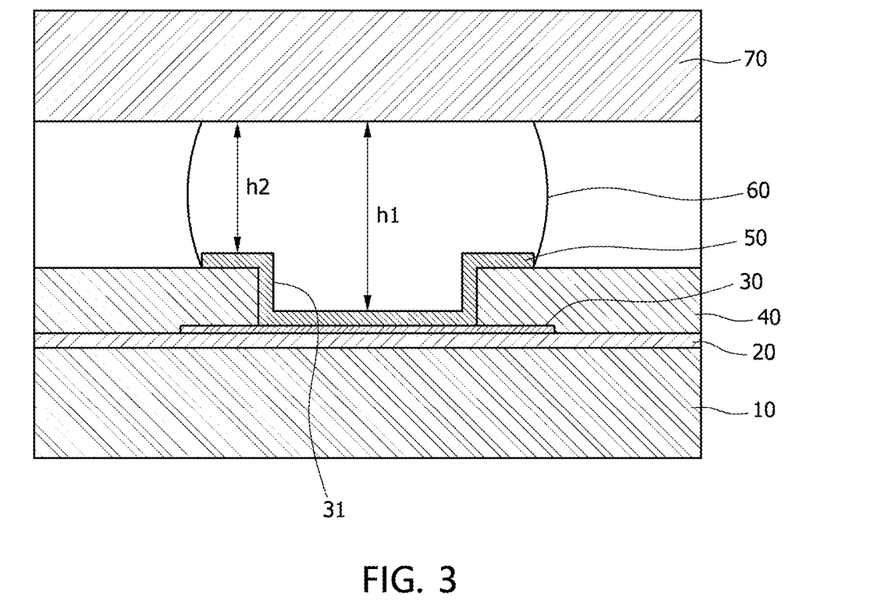
FIG. 3 is a detail view of a part of FIG. 2.

FIG. 2 is a cross-sectional view illustrating a semiconductor package according to an exemplary embodiment of the present invention, and FIG. 3 is a detail cross-sectional view illustrating a main portion of FIG. 2.

Referring to FIGS. 2 and 3, the semiconductor package according to the exemplary embodiment of the present invention includes a semiconductor chip 10, a resin coated film 20 positioned on the semiconductor chip 10, a re-distribution layer 30 which is positioned on a part of an upper portion of the resin coated film 20 and is in contact with an electrode of the semiconductor chip 10 through an opening region of the resin coated film 20, a passivation layer 40 which is positioned at a part of a peripheral region of the re-distribution layer 30 other than a central portion of the re-distribution layer 30 and on an entire upper surface of the resin coated film 20 and absorbs and disperses heat to reduce stress, an under bump metallization 50 which is in contact with the re-distribution layer 30 through an opening of the passivation layer 40 so that a step is formed, a solder ball 60 which is disposed on the under bump metallization 50 and of which a central portion is positioned in a lower region of the step of the under bump metallization 50 and a peripheral portion is positioned on an upper region of the step of the under bump metallization 50, and a printed circuit board 70 disposed above the semiconductor chip 10 to be in parallel thereto such that the electrode is in contact with the solder ball 60.

Hereinafter, a configuration and a function of the semiconductor package according to the exemplary embodiment of the present invention which is formed as described above will be described in detail, and a method of manufacturing the same will be described with reference to cross-sectional views for describing a sequence of a manufacturing process of FIGS. 4A to 4C.

Figure 4A:
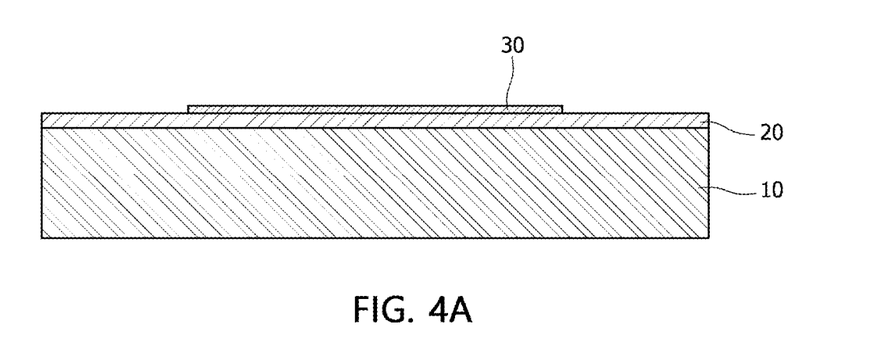
FIGS. 4A to 4C are cross-sectional views for describing a sequence of a manufacturing process of the semiconductor package according to the exemplary embodiment of the present invention.

As described in FIG. 4A, the semiconductor chip 10 is prepared. The semiconductor chip 10 is a wafer level chip, and a thickness thereof is different depending on a difference in process according to properties, usage, and the like. Generally, the thickness of the semiconductor chip 10 ranges from 250 to 368 μm.

The resin coated film 20 is formed on the semiconductor chip 10. At least two vertical openings are formed in the resin coated film 20 through an etching process, and an electrode part of the semiconductor chip 10 is exposed through the opening.

The resin coated film 20 may be formed using a coating method such as a spin coating method, and the opening may be formed through photolithography and etching processes. A thickness of the resin coated film 20 is 10 μm regardless of the thickness of the semiconductor chip 10.

Next, a metal is deposited and patterned to form the re-distribution layer 30 which is in contact with the electrode part of the exposed semiconductor chip 10.

Since an area of the electrode part formed in the semiconductor chip 10 is very small, the area thereof is extended using the re-distribution layer 30 to facilitate contact from the outside of the semiconductor chip 10. Here, a position of the electrode to be in contact from the outside may be changed to extend the area.

The re-distribution layer 30 is formed to have a thickness of 6 μm.

Figure 4B:
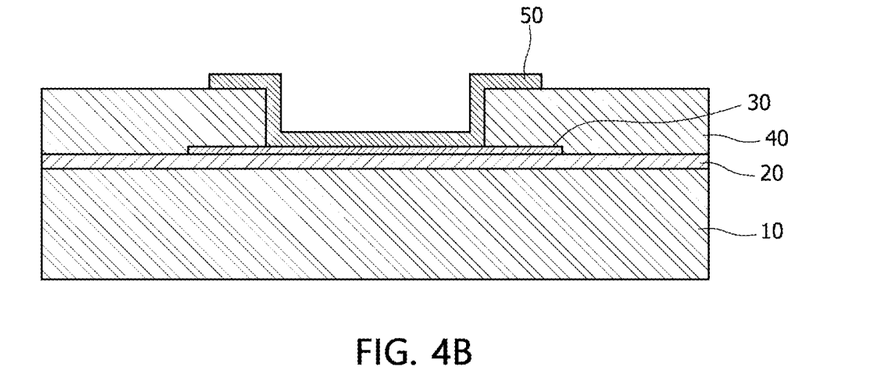

Next, as illustrated in FIG. 4B, the passivation layer 40 is formed on the re-distribution layer 30 and the resin coated film 20. A known insulating film, an epoxy resin film (SUEX), or the like may be used as the passivation layer 40.

The passivation layer 40 is formed to have a thickness which ranges from 7.5 to 50% of a diameter of the solder ball which will be described below. That is, when the diameter of the solder ball is 200 μm, the thickness of the passivation layer 40 may range from 15 to 100 μm.

The passivation layer 40 serves to absorb heat generated by the semiconductor chip 10 and to disperse the heat in a wide area so that a stress applied to the solder ball 60 is reduced. In a case in which the thickness is less than 7.5% (15 μm) thereof, since a heat absorption ratio is relatively small, a stress decreasing effect is small, and in a case in which the thickness is greater than 50% (100 μm) thereof, a thickness of the semiconductor package is increased, and thus a difficulty in a manufacturing process is increased.

A part of the passivation layer 40 is removed to expose a part of the upper central portion of the re-distribution layer 30 disposed under the passivation layer 40, and the metal is deposited and patterned to form the under bump metallization 50 in contact with the re-distribution layer 30. At this time, the under bump metallization 50 is formed to have a thickness of 9 μm.

When a part of the passivation layer 40 is removed to expose the re-distribution layer 30 disposed under the passivation layer 40, a step is formed between the exposed position of the re-distribution layer 30 and an upper surface of the remaining passivation layer 40. A height of the step is equal to the thickness of the passivation layer 40.

When the under bump metallization 50 is formed in a state in which the step is formed as described above, the step is formed on the under bump metallization 50 between a region in contact with the re-distribution layer 30 and a region positioned on the passivation layer 40.

Figure 4C:
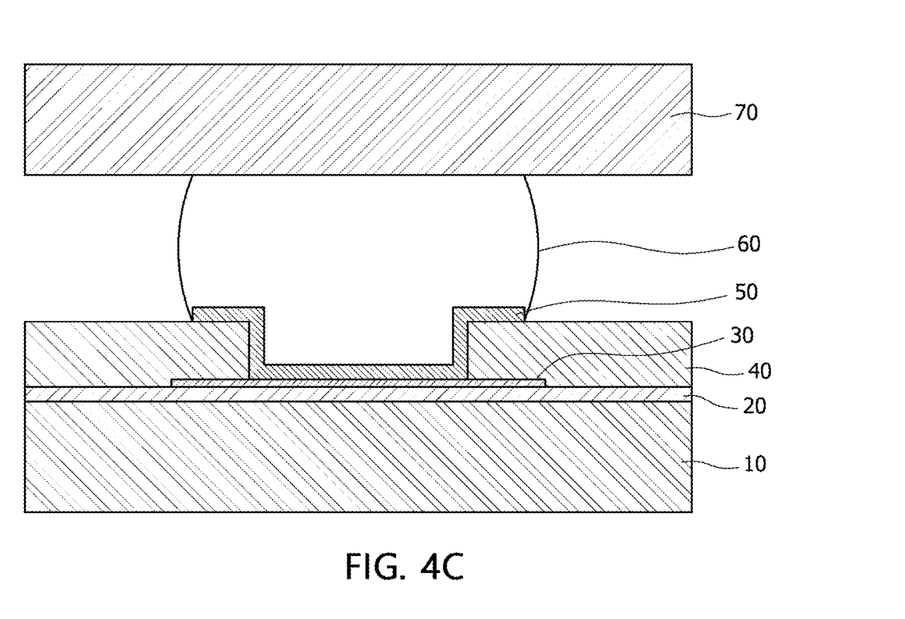

Next, as illustrated in FIG. 4C, the solder ball 60 is formed to be in contact with the under bump metallization 50 and an electrode of the printed circuit board 70 is heated and bonded to the solder ball 60.

The passivation layer 40 having a thickness ranging from 15 to 100 μm may absorb heat generated by the semiconductor chip 10 and disperse the heat as described above to reduce a thermal shock and a stress applied to the solder ball 60.

In addition, when the passivation layer 40 is formed to have a relatively thick thickness, the printed circuit board 70 and the semiconductor chip 10 may be maintained to be spaced apart from each other by a longer distance, and thus, a temperature deviation is decreased so that the stress applied to the solder ball 60 may be reduced during a heat conduction process.

Figure 5:
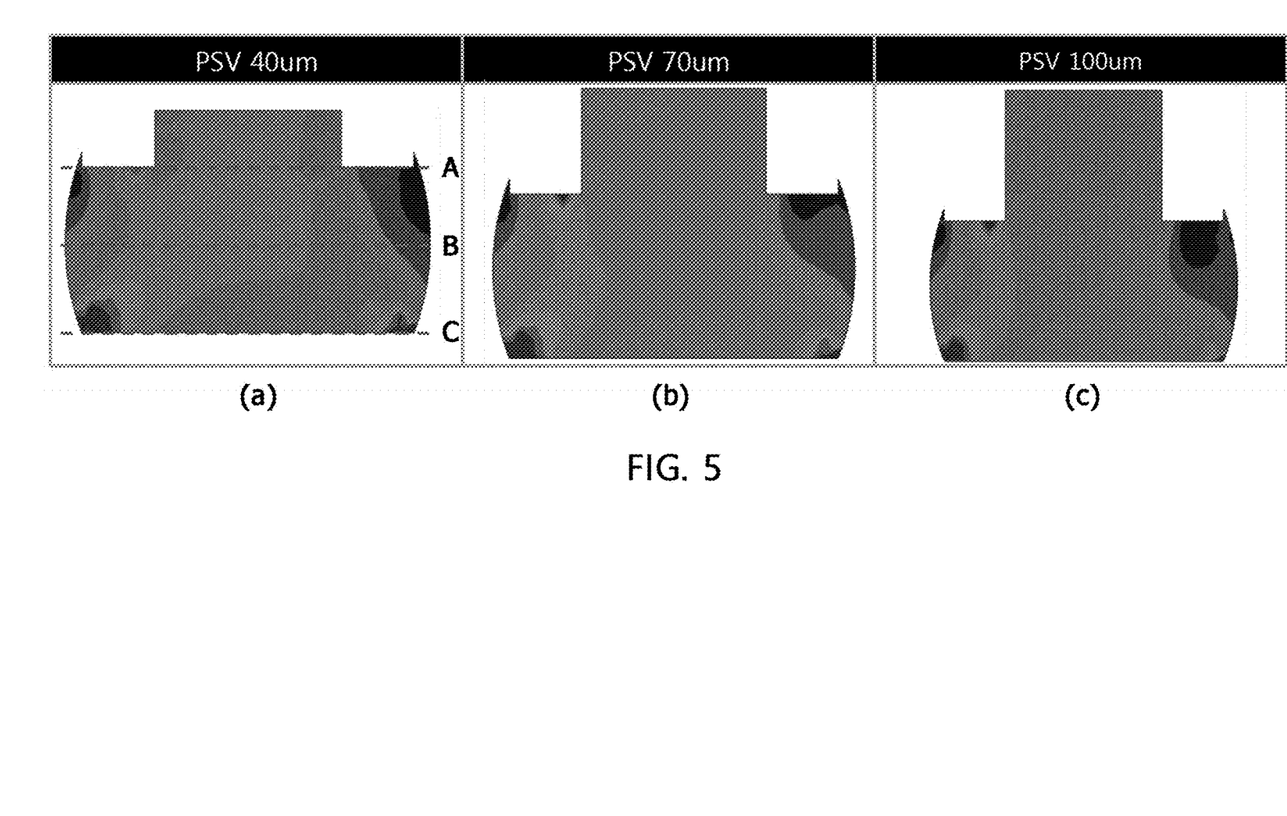
FIG. 5 is an image showing a simulation result of an extent of stress to a solder ball according to a thickness of a passivation layer.

FIG. 5 is an image showing a simulation result of an extent of stress to the solder ball 60 according to the thickness of the passivation layer 40.

FIG. 5A is an image of a simulation result when the passivation layer 40 is formed to have a thickness of 40 μm, FIG. 5B is an image of a simulation result when the passivation layer 40 is formed to have a thickness of 70 μm, and FIG. 5C is an image of a simulation result when the passivation layer 40 is formed to have a thickness of 100 μm.

As described above, as the thickness of passivation layer 40 is increased, the stress applied to the solder ball 60 may be decreased. However, when the thickness of the passivation layer 40 is increased to a range which is greater than 100 μm, a difficulty occurs in a manufacturing process, and the thickness of the semiconductor package is increased.

Figure 6:
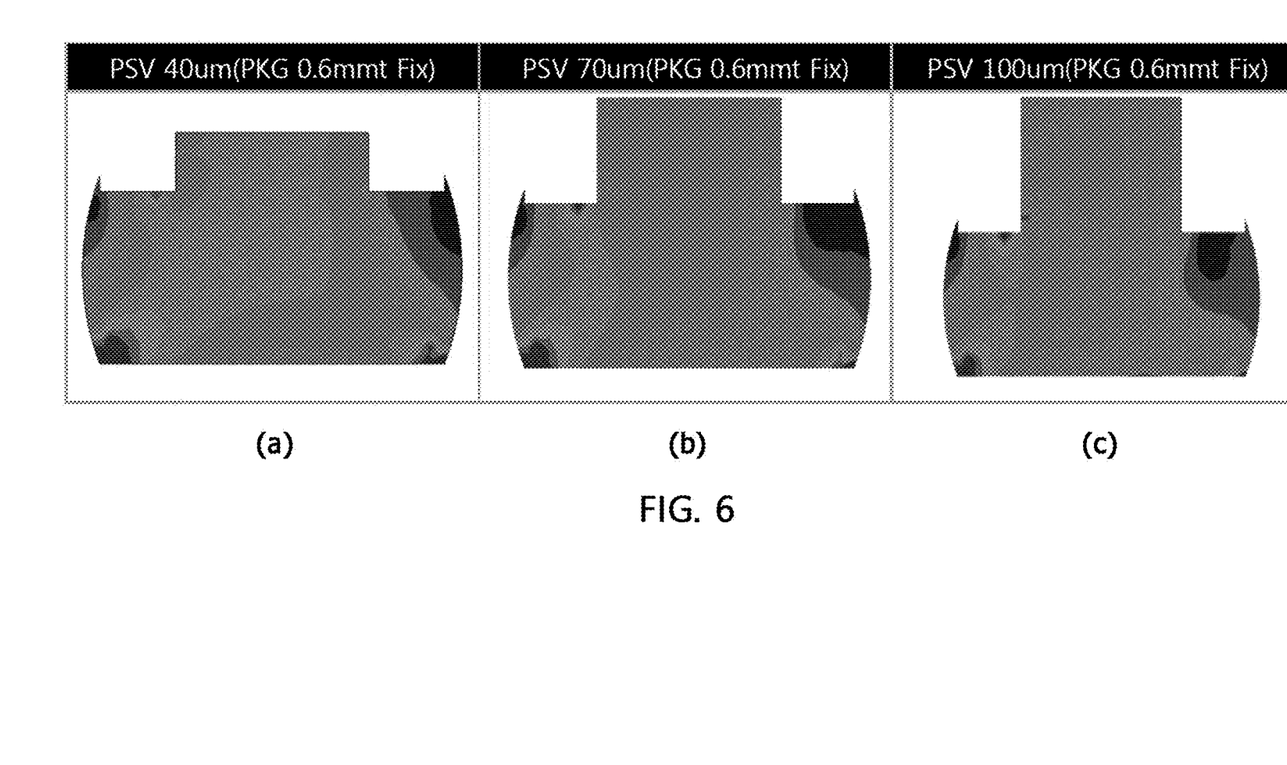
FIG. 6 is a view showing a simulation result of the extent of the stress to the solder ball according to the thickness of the passivation layer in a case in which thicknesses of the passivation layer and a semiconductor chip are adjusted in a state in which an overall thickness of the semiconductor package is fixed.

FIG. 6 is a view showing a simulation result of the extent of the stress to the solder ball 60 according to the thickness of the passivation layer 40 in a case in which the thicknesses of the passivation layer 60 and a semiconductor chip 10 are adjusted in a state in which an overall thickness of the semiconductor package is fixed.

The overall thickness of the semiconductor package is fixed to be 600 μm (0.6 mm), and the thickness of the semiconductor chip 10 is decreased by an amount by which the thickness of the passivation layer 40 is increased. The thickness of the semiconductor chip 10, which is a wafer level chip, may be successfully adjusted by grinding a rear surface of a substrate in which the semiconductor chip 10 is manufactured.

Here, as illustrated in FIG. 5, it may also be seen that as the thickness of the passivation layer 40 is increased, the stress applied to the solder ball 60 is decreased.

Figure 7:
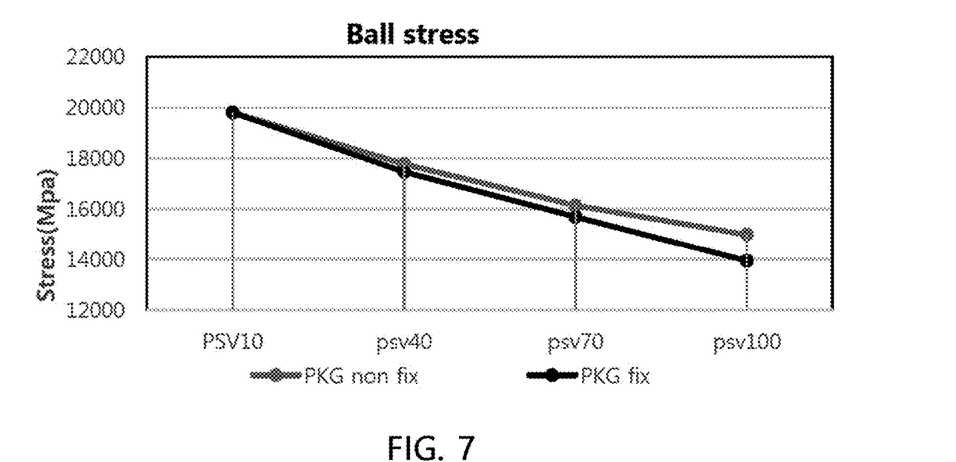
FIG. 7 is a graph showing the extent of the stress applied to the solder ball according to the thickness of the passivation layer.

FIG. 7 is a graph showing the extent of the stress (Mpa) applied to the solder ball 60 according to the thickness of the passivation layer 40.

In FIG. 7, "non fix" denotes an example in which the thickness of the semiconductor chip 10 is not adjusted and only the thickness of the passivation layer 40 is adjusted as illustrated in FIG. 5, and "fix" denotes an example in which the thicknesses of the semiconductor chip 10 and the passivation layer 40 are adjusted as illustrated in FIG. 6.

An effect of reducing the stress applied to the solder ball 60 is increased as the thickness of the semiconductor chip 10 is decreased and the thickness of the passivation layer 40 is increased.

In a state in which the thickness of the semiconductor package is not fixed to be 0.6 mm (a state of FIG. 5), when the thickness of the passivation layer 40 is 40, 70, or 100 μm, the stress applied to the solder ball 60 is decreased to about 18000, 16000, or 15000 Mpa, and the stress is not a strong stress which may cause the solder ball 60 to crack. In addition, in a state in which the thickness of the semiconductor package is fixed to be 0.6 mm (a state of FIG. 6), when the thickness of the passivation layer 40 is 40, 70, or 100 μm, the stress applied to the solder ball 60 is further reduced.

Particularly, when the thickness of the passivation layer 40 is 100 μm, the stress is reduced to 14000 Mpa, and a feature is seen that the stress is further reduced by about 1000 Mpa compared to a state in which the thickness of the semiconductor package is not fixed.

Compared to a stress applied to the solder ball 60 in a case in which the thickness of the passivation layer 40 is 10 μm like a conventional passivation layer in a state in which the thickness of the semiconductor package is not fixed, 24% of a total stress value of interfaces is decreased. Here, the interfaces are A, B, and C of FIG. 5.

In addition, it may be seen that the total stress value of the interfaces decreases 29% in a state in which the thickness of the semiconductor package is fixed.

As described above, the thickness of the passivation layer 40 may be is adjusted to reduce the stress applied to the solder ball 60, and accordingly, a crack may be prevented from occurring in the solder ball 60.

Referring to FIG. 3 again, in the present invention, the passivation layer 40 may be formed to have the relatively thicker thickness to reduce the stress due to heat and also stabilize a physical structure more.

The step having a height ranging from 15 to 100 μm is formed on the under bump metallization 50 in contact with the solder ball 60 due to the passivation layer 40, and a difference in height occurs between a height h1 of a central portion of the solder ball 60 and a height h2 of a peripheral portion thereof.

In other words, a circumference of a lower side of the solder ball 60 is in contact with and supported by a step interface 31 formed due to the passivation layer 40 and the under bump metallization 50, and a structure thereof is physically more stable.

Figure 8:
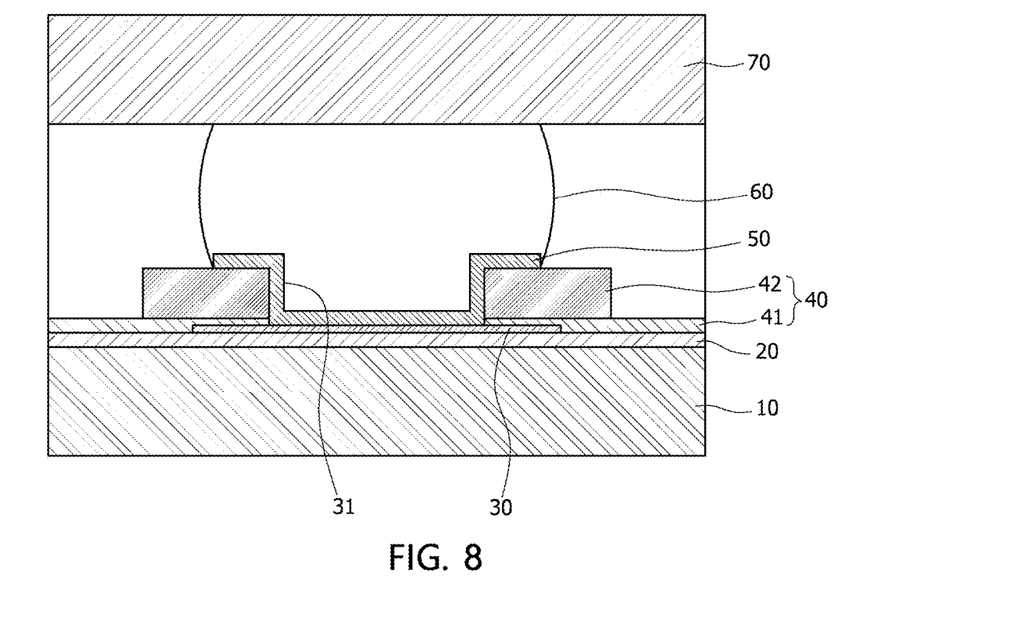
FIGS. 8 to 10 are cross-sectional views illustrating parts of semiconductor packages according to other embodiments of the present invention.

FIG. 8 is a cross-sectional view illustrating a part of a semiconductor package according to another embodiment of the present invention.

As illustrated in FIG. 8, a passivation layer 40 according to the present invention may be formed as a multilayer structure including a first passivation layer 41 and a second passivation layer 42.

Here, the first passivation layer 41 may be formed to have a thickness of 10 μm on an entirety of the resin coated film 20, and the second passivation layer 42 may be formed on a part of an upper portion of the first passivation layer 41 such that a step is formed on an under bump metallization 50.

The second passivation layer 42 is formed to have a thickness ranging from 5 to 90 μm.

Such a structure may increase a surface area of the passivation layer 40 so that heat may be easily discharged through a space between a printed circuit board 70 and the passivation layer 40.

In addition, an effect of a physical structure may also be expected in which a lower circumference of the solder ball 60 is supported by the step surface thereof.

Figure 9:
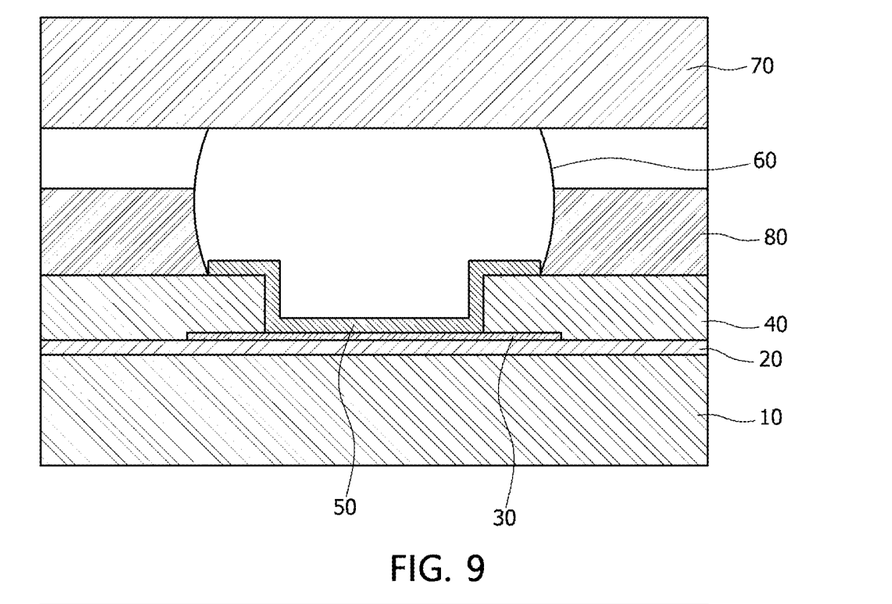

FIG. 9 is a cross-sectional view illustrating a part of a semiconductor package according to another embodiment of the present invention.

Referring to FIG. 9, an epoxy molding compound (EMC) 80 is further formed in the structure described with reference to FIG. 3 to surround a peripheral portion of a solder ball 60.

As the EMC 80 is formed, heat may be more effectively absorbed and dispersed, and the solder ball 60 may be physically supported more stably.

Here, the EMC 80 may have a thickness of 60 μm.

Figure 10:
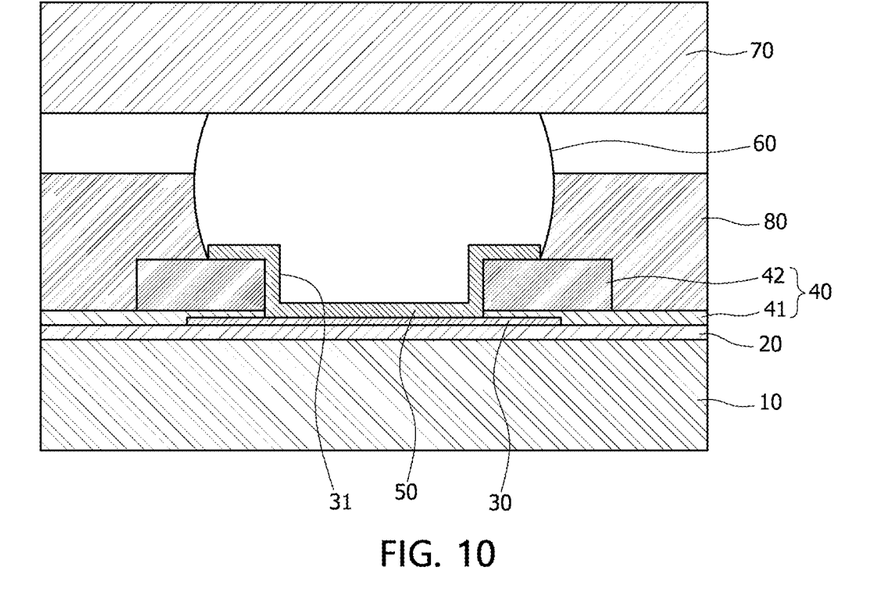

As illustrated in FIG. 10, the EMC 80 may be applied to the embodiment illustrated in FIG. 8.

Figure 11:
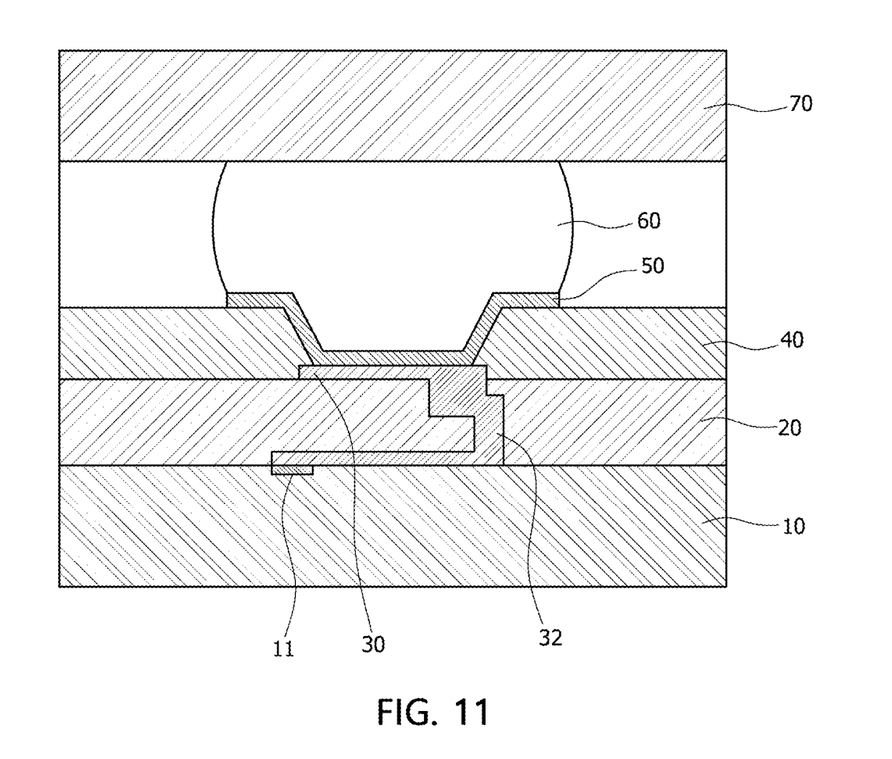
FIG. 11 is a cross-sectional view illustrating a semiconductor package according to another embodiment of the present invention.

FIG. 11 is a cross-sectional view illustrating a part of a semiconductor package according to another embodiment of the present invention.

In the above described embodiments, the embodiment was described in which the passivation layer 40 is formed to have the thickness ranging from 15 to 100 μm, which is thicker than a thickness of a conventional passivation layer, to absorb and disperse heat generated by the semiconductor chip 10.

Referring to FIG. 11, a thickness of a resin coated film 20 may range from 7.5 to 50% of a diameter of a solder ball 60. That is, in a case in which the diameter of the solder ball 60 is 200 μm, the thickness of the resin coated film 20 is increased to 15 to 100 μm to absorb and disperse heat generated by a semiconductor chip 10. Here the resin coated film may be formed as a single layer or a multilayer structure.

When the thickness of the resin coated film 20 is increased, the semiconductor chip 10 in which heat is generated during operation and a printed circuit board 70 are spaced apart from each other by a longer distance, and thus a temperature deviation is decreased to reduce a stress applied to a solder ball 60 during a heat conduction process.

A height of a plug 32, which electrically connects a chip pad 11 provided in the semiconductor chip 10 to the re-distribution layer 30, is increased to use the resin coated film 20 which is thicker compared to a conventional resin coated film.

In addition, the specific configurations of the above-described embodiments may be applied to the other embodiment of the present invention described with reference to FIG. 11. For example, an EMC 80 supporting a side portion of the solder ball 60 may be formed on a passivation layer 40.

In addition, a rear surface of the semiconductor chip 10 may be ground by an amount by which the thickness of the resin coated film 20 is increased so that an overall thickness of the semiconductor package may be constant.

As described above, in the present invention, the thickness of the passivation layer 40 or the resin coated film 20 may be adjusted to use the passivation layer 40 or the resin coated film 20 as a thermal buffer layer and may decrease a temperature deviation while heat is absorbed, dispersed, and conducted so that a crack is prevented from occurring in the solder ball 60.

As described above, the present invention has an effect of preventing a crack by substantially increasing a height of a solder ball to minimize an effect due to a difference in temperature between a semiconductor chip and a printed circuit board.

The present invention has an effect of improving durability and reliability of a semiconductor device by preventing the crack of the solder ball.

In addition, the present invention has an effect of improving durability and reliability by supporting a side portion of the solder ball using a physical component.

The present invention is not limited to the above-described embodiments, and it is clear to those skilled in the art that the present invention can be variously modified, changed, and performed without departing from the technological scope of the present invention.

What is claimed is:

1. A semiconductor package which electrically connects a semiconductor chip and a printed circuit board using a solder ball, the semiconductor package further comprising a thermal buffer layer which is positioned on a semiconductor chip, absorbs and disperse heat generated by the semiconductor chip, increases a distance between the semiconductor chip and a printed circuit board to decrease a deviation of a heat conduction process, and has a thickness ranging from 7.5 to 50% of a diameter of a solder ball,
wherein the thermal buffer layer includes a resin coated film in contact with chip pad side surface of the semiconductor chip and a passivation layer formed on the resin coated film,
wherein the passivation layer has a multilayer structure, wherein:
a lowest layer of the multilayer structure is positioned on an entirety of the resin coated layer; and
a highest layer of the multilayer structure is disposed on a part of the resin coated layer such that a step is formed on an under bump metallization on which the solder ball is seated.

2. The semiconductor package of claim 1, wherein the thermal buffer layer has the thickness ranging from 15 to 100 μm.

3. The semiconductor package of claim 1, wherein:
the under bump metallization includes a lower region of the step, which is a region in contact with a re-distribution layer, an upper region of the step, which is positioned on the passivation layer, and a step surface, which connects the upper region and the lower region of the step; and
a central portion of the solder ball is positioned on the lower region of the step and a peripheral portion of the solder ball is positioned on the upper region of the step.

4. The semiconductor package of claim 2, wherein the thickness of the thermal buffer layer and a thickness of the semiconductor chip are adjusted such that an overall thickness of the semiconductor package is constant.

5. The semiconductor package of claim 1, further comprising an epoxy molding compound which supports a side portion of the solder ball on the thermal buffer layer.

6. A method of manufacturing a semiconductor package, the method comprising:
a) forming a resin coated film on a semiconductor chip and forming a re-distribution layer in contact with an electrode of the semiconductor chip on a part of an upper portion of the resin coated film;
b) forming a passivation layer which is positioned on the resin coated film and is a thermal buffer layer, which exposes an upper central portion of the re-distribution layer, to have a thickness ranging from 7.5 to 50% of a diameter of a solder ball;

c) forming an under bump metallization in contact with the re-distribution layer; and d) forming the solder ball which electrically connects the under bump metallization and a printed circuit board.

7. The method of claim 6, wherein the passivation layer is formed as a plurality of layers, wherein:

a lowest layer of the plurality of layers is formed on an entirety of the resin coated film; and a highest layer thereof is formed to be positioned under a peripheral portion of the under bump metallization.

8. The method of claim 6, wherein:

the under bump metallization includes a lower region of a step, which is a region in contact with the re-distribution layer, an upper region of the step, which is positioned on the passivation layer, and a step surface which connects the upper region and the lower region of the step; and a central portion of the solder ball is positioned on the lower region of the step and a peripheral portion of the solder ball is positioned on the upper region of the step.

9. The method of claim 6, further comprising forming an epoxy molding compound, which supports a side portion of the solder ball, on the thermal buffer layer.

10. The method of claim 6, wherein a thickness of the thermal buffer layer and a thickness of the semiconductor chip are adjusted such that an overall thickness of the semiconductor package is constant.

11. The method of claim 10, wherein a rear surface of the semiconductor chip is ground by an amount by which the thickness of the thermal buffer layer is increased.

12. A method of manufacturing a semiconductor package comprising:

a-1) forming a resin coated film, which is a thermal buffer layer, on a semiconductor chip to have a thickness ranging from 7.5 to 50% of a diameter of a solder ball and forming a re-distribution layer in contact with an electrode of the semiconductor chip on a part of an upper portion of the resin coated film;

b-1) forming a passivation layer which is positioned on the resin coated film and is a thermal buffer layer which exposes an upper central portion of the re-distribution layer;

c-1) forming an under bump metallization in contact with the re-distribution layer; and d-1) forming the solder ball which electrically connects the under bump metallization and a printed circuit board.

13. The method of claim 12, wherein:

the under bump metallization includes a lower region of a step, which is a region in contact with the re-distribution layer, an upper region of the step, which is positioned on the passivation layer, and a step surface which connects the upper region and the lower region of the step; and a central portion of the solder ball is positioned on the lower region of the step and a peripheral portion of the solder ball is positioned on the upper region of the step.

14. The method of claim 12, further comprising forming an epoxy molding compound, which supports a side portion of the solder ball, on the thermal buffer layer.

15. The method of claim 12, wherein a thickness of the thermal buffer layer and a thickness of the semiconductor chip are adjusted such that an overall thickness of the semiconductor package is constant.

16. The method of claim 15, wherein a rear surface of the semiconductor chip is ground by an amount by which the thickness of the thermal buffer layer is increased.

\* \* \* \* \*